(12) United States Patent
Kim et al.

(10) Patent No.: US 12,161,005 B2
(45) Date of Patent: Dec. 3, 2024

(54) LIGHT EMITTING DEVICE, METHOD FOR MANUFACTURING THE SAME, AND ELECTRONIC DEVICE INCLUDING THE SAME

(71) Applicant: SAMSUNG ELECTRONICS CO., LTD., Suwon-si (KR)

(72) Inventors: Kwanghee Kim, Seoul (KR); Hongkyu Seo, Gwacheon-si (KR); Won Sik Yoon, Seoul (KR); Oul Cho, Hwaseong-si (KR); Tae Hyung Kim, Seoul (KR); Jaeyong Lee, Suwon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 544 days.

(21) Appl. No.: 17/522,316

(22) Filed: Nov. 9, 2021

(65) Prior Publication Data
US 2022/0149307 A1    May 12, 2022

(30) Foreign Application Priority Data
Nov. 10, 2020    (KR) .......................... 10-2020-0149307

(51) Int. Cl.
*H01L 51/50* (2006.01)
*H10K 50/11* (2023.01)
(Continued)

(52) U.S. Cl.
CPC .......... *H10K 50/115* (2023.02); *H10K 50/11* (2023.02); *H10K 71/12* (2023.02); *H10K 85/40* (2023.02); *H10K 2101/30* (2023.02); *H10K 2101/40* (2023.02)

(58) Field of Classification Search
None
See application file for complete search history.

(56) References Cited

U.S. PATENT DOCUMENTS 7,081,234 B1    7/2006   Qi et al.
10,003,037 B2   6/2018   Luchinger et al.
(Continued)

FOREIGN PATENT DOCUMENTS

JP    2005298818 A    10/2005
JP    2018157102 A    10/2018
(Continued)

OTHER PUBLICATIONS

Eunjoo Jang et al. White-Light-Emitting Diodes with Quantum Dot ColorConverters for Display Backlights, Adv. Mater. 2010, 22, 3076-3080.
(Continued)

*Primary Examiner* — Gregory D Clark
(74) *Attorney, Agent, or Firm* — CANTOR COLBURN LLP

(57) ABSTRACT

A light emitting device including a first electrode and a second electrode each having a surface opposite the other, a light emitting layer disposed between the first electrode and the second electrode, and an electronic auxiliary layer disposed between the light emitting layer and the second electrode, wherein the electron auxiliary layer includes metal oxide nanoparticles and an orthosilicate compound.

24 Claims, 9 Drawing Sheets

(51) Int. Cl.
H10K 50/115 (2023.01)
H10K 71/12 (2023.01)
H10K 85/40 (2023.01)
H10K 101/30 (2023.01)
H10K 101/40 (2023.01)

(56) References Cited

U.S. PATENT DOCUMENTS

| | | | |
|---|---|---|---|
| 10,396,306 | B2 | 8/2019 | Kim et al. |
| 10,502,995 | B2 | 12/2019 | Rantala et al. |
| 10,749,130 | B2 | 8/2020 | Kim et al. |
| 2017/0125682 | A1* | 5/2017 | Ha .......... C09K 11/06 |
| 2020/0091450 | A1 | 3/2020 | Kim et al. |
| 2020/0235326 | A1 | 7/2020 | Rahmati et al. |

FOREIGN PATENT DOCUMENTS

| | | | |
|---|---|---|---|
| KR | 20150137101 | A | 12/2015 |
| KR | 20160047022 | A | 5/2016 |
| KR | 20170023982 | A | 3/2017 |
| KR | 20190021946 | A | 3/2019 |
| KR | 20190029470 | A | 3/2019 |
| KR | 1980979 | B1 | 5/2019 |
| KR | 20190079111 | A | 7/2019 |
| KR | 20190108389 | A | 9/2019 |
| WO | 2014161100 | A1 | 10/2014 |
| WO | 16128133 | A1 | 8/2016 |
| WO | 19071362 | A1 | 4/2019 |

OTHER PUBLICATIONS

Heng Zhang, et al., An ZnMgO:PVP inorganic-organic hybrid electrontransport layer: towards efficient bottom-emissionand transparent quantum dot light-emitting diodes, J. Mater. Chem. C., 2019, vol. 7, Issue. 8, pp. 2291-2298.
Huixia Luo, et al., Origin of Subthreshold Turn-On in Quantum-Dot Light-Emitting Diodes, ACS Nano 2019, 13, 7, 8229-8236.
Junfeng Wei, et al., Silane-Capped ZnO Nanoparticles for Use asthe Electron Transport Layer in InvertedOrganic Solar Cells, ACS Nano., 2018, vol. 12, pp. 5518-5529.
Kiyoshi Matsuyamaa, et al., Formation of poly(methyl methacrylate)-ZnO nanoparticle quantumdot composites by dispersion polymerization in supercritical CO2, J. of Supercritical Fluids 103 (2015) 83-89.
Krishna P. Acharya, et al., High efficiency quantum dot light emitting diodesfrom positive aging, Nanoscale, 2017, 9, 14451-14457.
Qiang Su, et al., Enhancing the Performance of Quantum-Dot Light-Emitting Diodesby Postmetallization Annealing, ACS Appl. Mater. Interfaces, 2018, 10, 23218-23224.
Qiang Su, Origin of Positive Aging in Quantum-Dot Light-EmittingDiodes, Adv. Sci. 2018, 1800549, 7 pp.
Seth Coe, Wing-Keung Woo, Moungi Bawendi & Vladimir Bulovic, Electroluminescence from single monolayers of nanocrystals inmolecular organic devices, Nature 2002, vol. 420, 800-803.
Sing Ling Chia, et al., Reducing ZnO nanoparticlestoxicity through silica coating, Heliyon, http://dx.doi.org/10.1016/j.heliyon 2016, Article No. e00177, 18 pp.
Tae-Ho Kim et al. Full-colour quantum dot displays fabricated bytransfer printing, Nature Photonics, Mar. 2011, vol. 5, 176-182.
Yizhe Sun, et al., Efficient quantum dot light-emitting diodes with aZn0.85Mg0.15O interfacial modification layer, Nanoscale, 2017, 9, 8962-8969.
English Translation of Office Action dated Sep. 2, 2024 issued in corresponding Korean Patent Application No. 10-2020-0149307, 9 pp.
Office Action dated Sep. 2, 2024 issued in corresponding Korean Patent Application No. 10-2020-0149307, 7 pp.

* cited by examiner

LIGHT EMITTING DEVICE, METHOD FOR MANUFACTURING THE SAME, AND ELECTRONIC DEVICE INCLUDING THE SAME

CROSS-REFERENCE TO RELATED APPLICATION

This application claims priority to Korean Patent Application No. 10-2020-0149307 filed in the Korean Intellectual Property Office on Nov. 10, 2020, and all the benefits under 35 U.S.C. § 119, the content of which is herein incorporated by reference in its entirety.

BACKGROUND

1. Field

A light emitting device, a method for manufacturing the light emitting device, and a display device including the light emitting device are disclosed.

2. Description of the Related Art

Quantum dots are nanocrystal semiconductor materials having a diameter of less than or equal to around 10 nanometers (nm), and which exhibit quantum confinement effects. Quantum dots emit light as excited electrons transition from a conduction band to a valance band. Quantum dots emit light at a maximum wavelength depending upon the average particle size for a given compositional material, and can provide relatively clean light with a narrow wavelength region in comparison to other commonly used phosphors.

In addition, a light emitting layer including quantum dots, and the various types of light emitting devices including the light emitting layer, may reduce cost of production compared to an organic light emitting diode with a light emitting layer including phosphorescence and/or phosphor material, and as noted, the maximum wavelength of the light emitted can be adjusted with a change in the average particle size of quantum dots, regardless of the presence of other light emitting organic materials in the light emitting layer.

The luminous efficiency of the light emitting layer including quantum dots is determined by a quantum efficiency of the quantum dots, a balance of charge carriers, and light extraction efficiency, leakage current, and the like. In order to improve the luminous efficiency of a light emitting layer, methods such as greater confinement of excitons in the light emitting layer, greater control and efficiency of the transport of holes and electrons to the quantum dots, preventing leakage current, etc, can be tried.

SUMMARY

A light emitting device capable of improving performance and luminance, e.g., an increase in life-span of the device by suppressing exciton quenching, minimizing the leakage of holes into the electron auxiliary layer, or by improving electron injection characteristics.

Another embodiment provides a method of manufacturing the light emitting device.

Another embodiment provides a display device including the light emitting device.

According to an embodiment, a light emitting device includes a first electrode and a second electrode each having a surface opposite the other, a light emitting layer disposed between the first electrode and the second electrode, and an electronic auxiliary layer disposed between the light emitting layer and the second electrode, wherein the electron auxiliary layer includes metal oxide nanoparticles and an orthosilicate compound.

At least a portion of the orthosilicate compound may be bound to a surface of the metal oxide nanoparticles.

The metal oxide nanoparticles may include a coating layer on a surface, the coating layer including at least a portion of the orthosilicate compound.

The orthosilicate compound may be represented by Chemical Formula 1.

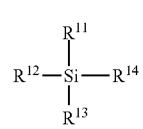

Chemical Formula 1

In Chemical Formula 1, $R^{11}$ to $R^{14}$ are independently a hydroxy group, a halogen, a substituted or unsubstituted C1 to C8 linear or branched alkoxy group, or a substituted or unsubstituted C6 to C12 aryloxy group.

The orthosilicate compound may include tetramethylorthosilicate, tetraethylorthosilicate, tetrabutylorthosilicate, or a combination thereof.

The orthosilicate compound may be present in an amount of about 5 parts by weight to about 500 parts by weight, based on 100 parts by weight of the metal oxide nanoparticles.

The electron auxiliary layer may further include a first silane compound represented by Chemical Formula 2.

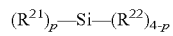

Chemical Formula 2

In Chemical Formula 2, $R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C6 to C12 aryloxy group, a substituted or unsubstituted C2 to C20 alkynyl group, C2 to C20 alkenyl group, a substituted or unsubstituted C1 to C20 amine group, —C(═O)OR' (wherein R' is a 01 to C20 linear or branched alkyl group), or —C(═O)ONR'R" (wherein R' and R" are independently a C1 to C20 linear or branched alkyl group), and $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and p is an integer of 1 to 3.

The first silane compound may include trimethoxysilane, methyltrimethoxysilane, ethyltrimethoxysilane, propyltrimethoxysilane, butyltrimethoxysilane, pentyltrimethoxysilane, hexyltrimethoxysilane, octyltrimethoxysilane, triethoxysilane, methyltriethoxysilane, ethyltriethoxysilane, propyltriethoxysilane, butyltriethoxysilane, pentyltriethoxysilane, hexyltriethoxysilane, octyltriethoxysilane, dimethoxysilane, dimethyldimethoxysilane, diethyldimethoxysilane, dipropyldimethoxysilane, dibutyldimethoxysilane, dipentyldimethoxysilane, dihexyldimethoxysilane, dioctyldimethoxysilane, diethoxysilane, dimethyldiethoxysilane, diethyldiethoxysilane, dipropyldiethoxysilane, dibutyldiethoxysilane, dipentyldiethoxysilane, dihexyldiethoxysilane, dioctyldiethoxysilane, phenyltrimethoxysilane, diphenyldimethoxysilane, phenyltriethoxysilane, diphenyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminooctyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, aminooctyltriethoxysilane, trichlorosilane, methyltrichlorosilane, ethyltrichlorosilane, propyltrichlorosilane, butyltrichlorosilane, pentyltrichlorosilane, hexyltrichlorosilane, octyltrichlorosilane, or a combination thereof.

The electron auxiliary layer may further include a second silane compound represented by Chemical Formula 3.

$(R^{31})_q\text{—Si—}(R^{32})_{4-q}$     Chemical Formula 3

In Chemical Formula 3, $R^{31}$ is a reactive functional group capable of photo-crosslinking or thermal-crosslinking. Exemplary $R^{31}$ groups may include: a vinyl group; a vinyloxy group; a (meth)acryl group; a (meth)acryloxy group; an epoxy group; a substituted or unsubstituted C2 to C30 alkenyl group; a substituted or unsubstituted C2 to C30 alkynyl group; a spiro-orthoester group; a substituted or unsubstituted C3 to C30 alicyclic organic group having a double bond or a triple bond in the ring; a substituted or unsubstituted C3 to C30 heterocycloalkyl group having a double bond or a triple bond in the ring; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group, and $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and q is an integer of 1 to 3.

The second silane compound may include vinyl trimethoxysilane, vinyl triethoxysilane, vinyl tris(2-methoxyethoxysilane), or a combination thereof.

The first silane compound, and the second silane compound, may be present at a concentration independent of the other though in a total amount of about 1 part by weight to about 100 parts by weight, based on 100 parts by weight of the orthosilicate compound.

The metal oxide nanoparticles of the electron auxiliary layer may be surface-treated with a base including a hydroxy group (OH).

The metal oxide may include Zn, Mg, Ca, Zr, W, Li, Ti, Y, Al, Rb, or a combination thereof.

The metal oxide may be represented by Chemical Formula 4.

$Zn_{1-x}M_xO$     [Chemical Formula 4]

In Chemical Formula 4, M is Mg, Ca, Zr, W, Li, Ti, Y, Al, Rb, or a combination thereof, and $0 \leq x \leq 0.5$.

The metal oxide nanoparticles may have an average particle size of about 1 nanometer (nm) to about 100 nm.

The light emitting layer may include quantum dots.

The light emitting device may further include a hole auxiliary layer including a hole injecting layer (HIL), a hole transporting layer (HTL), an electron blocking layer (EBL), or a combination thereof between the first electrode and the light emitting layer.

According to another embodiment, a method of manufacturing a light emitting device includes mixing metal oxide nanoparticles and an orthosilicate compound to prepare a mixed solution; and applying the mixed solution to form an electron auxiliary layer.

The applying of the mixed solution may include spin coating, bar coating, spray coating, slit coating, inkjet printing, nozzle printing, spraying, or doctor blade coating.

The method of manufacturing the light emitting device may further include contacting the prepared electron auxiliary layer with a base including a hydroxy group (OH).

The base including the hydroxy group may include alkaline metal hydroxide, alkylammonium hydroxide, or a combination thereof.

The contacting of the prepared electron auxiliary layer with the base including the hydroxy group may include mixing the base in a solvent to prepare a base solution, and applying the base solution on the electron auxiliary layer in the form of a coating, or dipping the electron auxiliary layer in the base solution.

According to another embodiment, an electronic device including the light emitting device is provided.

The electronic device may be a display device, a sensor, a photodetector, a photoelectric conversion device, a laser, or a linear optical device.

The light emitting device according to an embodiment may exhibit improved performance, e.g., improved luminance or greater life-span or device stability. Although not limiting the claimed subject matter in any way, Applicant believes that the observed improvement in device performance may arise from the minimization of oxygen vacancy and hydroxide groups on a surface of the metal oxide nanoparticles, the minimization of surface defects by introducing an orthosilicate compound to an electron auxiliary layer including metal oxide nanoparticles, improving the surface flatness of the electron auxiliary layer including the metal oxide nanoparticles by a coupling action of the orthosilicate compound, or suppressing exciton quenching or hole leak phenomena to improve electron injection characteristics.

DETAILED DESCRIPTION

Figure 1:
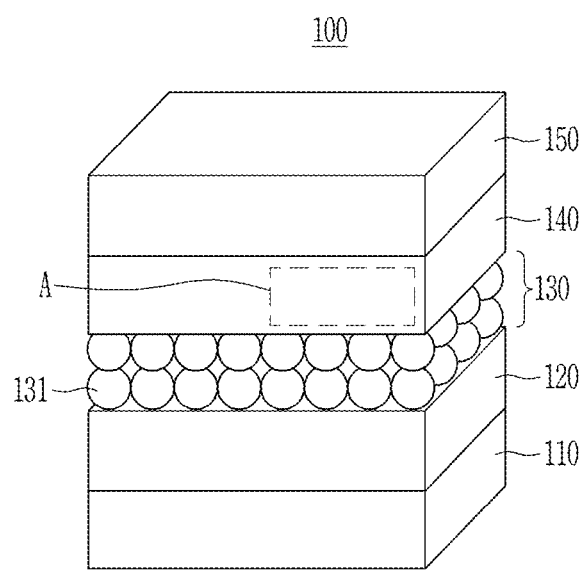
FIG. 1 is a schematic representation of a light emitting device according to an embodiment.

Advantages and characteristics of this disclosure, and a method for achieving the same, will become evident referring to the following exemplary embodiments together with the attached drawings. However, the embodiments should not be construed as being limited to the embodiments set forth herein. If not defined otherwise, all terms (including technical and scientific terms) in the specification may be defined as commonly understood by one skilled in the art. It will be further understood that terms such as those defined in a generally-used dictionary should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. In addition, unless explicitly described to the contrary, the word "comprise" and variations such as "comprises" or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the present specification, it will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Like reference numerals refer to like elements throughout.

Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. As used herein, when a definition is not otherwise provided, the term "substituted" refers to a compound or a moiety wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—ON), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, "hetero" refers to one including 1 to 3 heteroatoms of N, O, S, Si, P, or a combination thereof.

As used herein, "carbonylalkyl" is a divalent group of the formula —C(=O)alkyl, and "carbonylalkoxy" is a divalent group of the formula —C(=O)Oalkyl.

As used herein, "Group" refers to a group of Periodic Table.

As used herein, "Group I" may include Group IA and Group IB, and examples of Group I include Li, Na, K, Rb, or Cs, but is not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

Hereinafter, a light emitting device according to an embodiment will be described with reference to the drawings. In the drawings, the thickness of layers, films, panels, regions, etc., are exaggerated for clarity. Like reference numerals designate like elements throughout the specification.

FIG. 1 is a schematic representation of a light emitting device according to an embodiment.

Referring to FIG. 1, a light emitting device 100 according to an embodiment includes a first electrode 110 and a second electrode 150 each having a surface opposite the other, and a light emitting layer 130 disposed between the first electrode 110 and the second electrode 150, and an electronic auxiliary layer 140 disposed between the second electrode 150 and the light emitting layer 130. Optionally, the light emitting device 100 may further include a hole auxiliary layer 120 disposed between the first electrode 110 and the light emitting layer 130.

The substrate (not shown) may be disposed at the first electrode 110 side or the second electrode 150 side. For example, the substrate may be disposed at the first electrode 110 side. The substrate may be a substrate including an insulating material (e.g., an insulating transparent substrate). The substrate may include glass; various polymers such as a polyester (e.g., polyethylene terephthalate (PET), polyethylene naphthalate (PEN)), polycarbonate, polyacrylate, polyimide, polyamideimide, etc.; polysiloxane (e.g., polydimethylsiloxane (PDMS)); an inorganic material such as $Al_2O_3$, ZnO, etc.; or a combination thereof, but is not limited thereto. The substrate may be made of a silicon wafer or the like. Herein, "transparent" refers to light transmittance of greater than or equal to about 85%, for example, greater than or equal to about 88%, greater than or equal to about 90%, greater than or equal to about 95%, greater than or equal to about 97%, or greater than or equal to about 99% for light in a predetermined wavelength (e.g., light emitted from a quantum dot). The thickness of the substrate may be appropriately selected in consideration of the substrate material and the like, and is not particularly limited. The transparent substrate may have flexibility, e.g., be a plastic substrate. The substrate may be omitted.

One of the first electrode 110 and the second electrode 150 is an anode and the other is a cathode. For example, the first electrode 110 may be an anode and the second electrode 150 may be a cathode.

The first electrode 110 may be made a conductor, for example, a metal, a conductive metal oxide, or a combination thereof. The first electrode 110 may be, for example made of a metal such as nickel, platinum, vanadium, chromium, copper, zinc, or gold, or an alloy thereof; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto. For example, the first electrode 110 may include a transparent conductive metal oxide, for example, indium tin oxide (ITO).

The second electrode 150 may be made of a conductor, for example, a metal, a conductive metal oxide, and/or a conductive polymer. The second electrode 150 may be for example a metal or an alloy thereof such as aluminum, magnesium, calcium, sodium, potassium, titanium, indium, yttrium, lithium, gadolinium silver, tin, lead, cesium, and barium; a multi-layer structure material such as LiF/Al, $LiO_2$/Al, Liq/Al, LiF/Ca, and $BaF_2$/Ca, but is not limited thereto. The conductive metal oxide is the same as described above.

At least one of the first electrode 110 and the second electrode 150 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 110 and the second electrode 150 is a non-light-transmitting electrode, it may be made of for example an opaque conductor such as aluminum (Al), silver (Ag), or gold (Au).

The thickness of the first electrode 110 and/or the second electrode 150 is not particularly limited and may be appropriately selected in consideration of device efficiency. For example, the thickness of the electrode may be greater than or equal to 5 nanometers (nm), for example, greater than or equal to about 50 nm. For example, the thickness of the electrode may be less than or equal to about 100 micrometers (μm), for example, less than or equal to about 10 μm, or less than or equal to about 1 μm, less than or equal to about 900 nm, less than or equal to about 500 nm, or less than or equal to about 100 nm.

The light emitting layer 130 may include a plurality of quantum dots 131. The quantum dots 131 (hereinafter, also referred to as "semiconductor nanocrystals") may include a Group II-VI compound, a Group III-V compound, a Group IV-VI compound, a Group IV element or compound, a Group compound, a Group I-II-IV-VI compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof. The Group II-VI compound may further include a Group III metal. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (e.g., InZnP). The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group compound include $CuInSe_2$, $CuInS_2$, CuInGaSe, and CuInGaS, but are not limited thereto. Examples of the Group I-II-IV-VI group compound include CuZnSnSe, and CuZnSnS, but are not limited thereto. The Group IV element or compound may be a single element selected from Si, Ge, and a mixture thereof; a binary compound selected from SiC, SiGe, and a mixture thereof.

For example, the quantum dots 131 may not include cadmium. The quantum dots 131 may include semiconductor nanocrystals based on a Group III-V compound including indium and phosphorus. The Group III-V compound may further include zinc. The quantum dots 131 may include a semiconductor nanocrystal based on a Group II-VI compound including a chalcogen element (e.g., sulfur, selenium, tellurium, or a combination thereof) and zinc.

In the quantum dots 131, the aforementioned binary element compound, ternary element compound, and/or quaternary element compound may exist in a uniform concentration in a particle or have different concentration distributions in the same particle. The semiconductor nanocrystal may have a core-shell structure in which the first semiconductor nanocrystal (core) surrounds the second semiconductor nanocrystal (shell) of the same/different composition. As an example, the quantum dots 131 may include a core including InP, InZnP, ZnSe, ZnSeTe, or a combination thereof, and a shell (or a multi-layered shell) having a composition different from the core and including InP, InZnP, ZnSe, ZnS, ZnSeTe, ZnSeS, or a combination thereof.

The interface between the core and the shell may have a concentration gradient in which the concentration of an element present in the shell decreases toward the center. In addition, the semiconductor nanocrystal may have a structure including one semiconductor nanocrystal core and a multi-layered shell surrounding the semiconductor nanocrystal core. In this case, the multi-layered shell structure has a shell structure of two or more layers, and each layer may have a single composition or alloy or concentration gradient.

The quantum dots 131 may include the shell material and the core material having different energy band gaps from each other. For example, the energy band gap of the shell material may be larger than that of the core material. Alternatively, the energy band gap of the shell material may be smaller than that of the core material. The quantum dots 131 may have a multi-layered shell. In the multi-layered shell, the energy band gap of the outer layer may be larger than the energy band gap of the inner layer (i.e., a layer close to the core). In the multi-layered shell, the energy band gap of the outer layer may be smaller than the energy band gap of the inner layer.

The quantum dots 131 may adjust the absorption/emission wavelength by adjusting the composition and size. The maximum emission peak wavelength of the quantum dot 131 may have a wavelength range from ultraviolet to infrared or higher. For example, the maximum emission peak wavelength of the quantum dots 131 may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission wavelength of the quantum dots 131 may be in the range of less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots 131 may be in the range of about 500 nm to about 650 nm. The maximum emission wavelength of the quantum dots 131 may be in the range of about 500 nm to about 540 nm. The maximum emission wavelength of the quantum dots 131 may be in the range of about 610 nm to about 640 nm.

The quantum dots 131 may have quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots 131 may have a relatively narrow spectrum. The quantum dots 131 may have a full width at half maximum (FWHM) of the emission wavelength spectrum of, for example, less than or equal to about 50 nm, for example less than or equal to about 45 nm, less than or equal to about 40 nm, or less than or equal to about 30 nm.

The quantum dots 131 may have a particle size of greater than or equal to about 1 nm and less than or equal to about 100 nm (e.g., a diameter or a longest length of a straight line across the particles). The quantum dots 131 may have a size of about 1 nm to about 20 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shapes of the quantum dots 131 are not particularly limited. For example, the shapes of the quantum dots 131 may include a sphere, a polyhedron, a pyramid, a multipod, a square, a rectangular parallelepiped, a nanotube, a nanorod, a nanowire, a nanosheet, or a combination thereof, but are not limited thereto.

As used herein, particle sizes (e.g., metal oxide particles and quantum dot particles) may be obtained from commercially available image analysis programs (e.g., image J) using images obtained from electron microscopy analysis (two-dimensional images). The average may be mean, mode, or median.

The quantum dots 131 may be commercially available or may be appropriately synthesized. When quantum dots 131 are colloid-synthesized, the particle size may be relatively freely controlled and uniformly controlled.

The quantum dots 131 may include for example an organic ligand having a hydrophobic moiety. The organic ligand moiety may be bound to surfaces of the quantum dots 131. The organic ligand may include RCOOH, RNH$_2$, R$_2$NH, R$_3$N, RSH, R$_3$PO, R$_3$P, ROH, RCOOR, RPO(OH)$_2$, RHPOOH, R$_2$POOH, or a combination thereof, wherein, R is independently a C3 (or C5) to C24 substituted or unsubstituted aliphatic hydrocarbon group such as a C3 (or C5) to C24 alkyl or alkenyl group, a C6 to C20 substituted or unsubstituted aromatic hydrocarbon group such as a C6 to C20 aryl group, or a combination thereof.

Examples of the organic ligand may a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, trioctyl amine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide pentyl phosphine oxide, tributyl phosphine oxide, octylphosphine oxide, dioctyl phosphine oxide, trioctyl phosphine oxide; diphenyl phosphine, triphenyl phosphine, an oxide compound thereof; C5 to C20 alkyl phosphonic acid, C5 to C20 alkyl phosphinic acid, and the like such as hexylphosphinic acid, octylphosphinic acid, dodecanephosphinic acid, tetradecanephosphinic acid, hexadecanephosphinic acid, or octadecanephosphinic acid, but are not limited thereto. The quantum dots 131 may include the hydrophobic organic ligand alone or as a mixture of one or more. The hydrophobic organic ligand may not include a photopolymerizable moiety such as an acrylate group or a methacrylate group.

For example, the light emitting layer 130 may include a monolayer of the quantum dots 131. Alternatively, the light emitting layer 130 may include one or more, for example, 2 or more, 3 or more, or 4 or more and 20 or less, 10 or less, 9 or less, 8 or less, 7 layers or less, or 6 layers or less of the monolayer of the quantum dots 131. The light emitting layer 130 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 130 may have a thickness of, for example about 10 nm to about 150 nm, about 10 nm to about 100 nm, or about 10 nm to about 50 nm.

The light emitting layer 130 may have a HOMO energy level of greater than or equal to about 5.4 electron volts (eV), greater than or equal to about 5.6 eV, greater than or equal to about 5.7 eV, greater than or equal to about 5.8 eV, greater than or equal to about 5.9 eV, or greater than or equal to about 6.0 eV. The light emitting layer 130 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. For example, the light emitting layer 130 may have a HOMO energy level of about 5.6 eV to about 6.0 eV.

The light emitting layer 130 may have a LUMO energy level of less than or equal to about 3.8 eV, for example, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The light emitting layer 130 may have a LUMO energy level of greater than or equal to about 2.5 eV. For example, the light emitting layer 130 may have an energy band gap of about 2.4 eV to about 2.9 eV.

The hole auxiliary layer 120 may be disposed between the first electrode 110 and the emission layer 130. The hole auxiliary layer 120 may be one layer or two or more layers, and may include, for example, a hole injection layer, a hole transport layer, and/or an electron blocking layer.

The hole auxiliary layer 120 may have a HOMO energy level that is matched with the HOMO energy level of the light emitting layer 130, and may enhance mobility of holes transferred from the hole auxiliary layer 120 to the light emitting layer 130.

The HOMO energy level of the hole auxiliary layer 120 (e.g., hole transport layer) contacting the light emitting layer 130 may be the same as or smaller than the HOMO energy level of the light emitting layer 130 within a range of less than or equal to about 1.0 eV. For example, a difference of HOMO energy levels between the hole auxiliary layer 120 and the light emitting layer 130 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 120 may be for example greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 120 may be about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

For example, the hole auxiliary layer 120 may include a hole injection layer near to the first electrode 110 and a hole transport layer near to the light emitting layer 130. Herein, the HOMO energy level of the hole injection layer may be about 5.0 eV to about 6.0 eV, about 5.0 eV to about 5.5 eV, or about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material included in the hole auxiliary layer 120 is not particularly limited and may include for example at least one of poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino) phenylcyclohexane (TAPC), p-type metal oxide (e.g., NiO, $WO_3$, $MoO_3$, etc.), a carbon-based material such as graphene oxide, and a combination thereof, but is not limited thereto.

In the hole auxiliary layer(s), a thickness of each layer may be appropriately selected. For example, the thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, or less than or equal to about 50 nm, but is not limited thereto.

The electron auxiliary layer 140 is disposed between the light emitting layer 130 and the second electrode 150. The electron auxiliary layer 140 may include for example an electron injection layer, an electron transport layer, and/or a hole blocking layer, but is not limited thereto.

For example, the electron auxiliary layer 140 may be an electron transport layer. The electron auxiliary layer 140 may include metal oxide nanoparticles.

The metal oxide may be an oxide of a metal including Zn, Mg, Ca, Zr, W, Li, Ti, Y, Al, Rb, or a combination thereof.

For example, the metal oxide may be represented by Chemical Formula 1.

$$Zn_{1-x}M_xO \qquad \text{Chemical Formula 1}$$

In Chemical Formula 1, M may be Mg, Ca, Zr, W, Li, Ti, Y, Al, Rb, or a combination thereof, and may be for example, Mg. In Chemical Formula 1, the x may be greater than or equal to about 0 and less than or equal to about 0.5, for example greater than or equal to about 0.01 and less than or equal to about 0.3, or greater than or equal to about 0.01 and less than or equal to about 0.15.

For example, the metal oxide may include zinc oxide, zinc magnesium oxide, or a combination thereof.

The nanoparticles may have an average particle size of greater than or equal to about 1 nm, for example, greater than or equal to about 1.5 nm, greater than or equal to about 2 nm, greater than or equal to about 2.5 nm, or greater than or equal to about 3 nm and less than or equal to about 100 nm, for example less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape, or a nanowire shape.

An absolute value of LUMO of the quantum dots 131 may be smaller than an absolute value of LUMO of the metal oxide. An absolute value of LUMO of the quantum dots 131 may be greater than an absolute value of LUMO of the metal oxide.

The metal oxide may have a LUMO absolute value of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

The metal oxide may have a HOMO absolute value of greater than or equal to about 5 eV, greater than or equal to about 5.5 eV, greater than or equal to about 6 eV, greater than or equal to about 6.5 eV, or greater than or equal to about 7 eV and less than or equal to about 8 eV, less than or equal to about 7.5 eV, less than or equal to about 7 eV, less than or equal to about 6.5 eV, or less than or equal to about 6 eV.

The metal oxide may have an energy bandgap of greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

In order to drive the light emitting device 100 including the quantum dots 131 with high efficiency, high luminance, and long life-span, the numbers of holes and electrons entering the light emitting layer 130 may be balanced and injected. In this case, an n-type electron transport layer (e.g., ZnMgO) having a deep valence band (VB) with a hole blocking property and a p-type hole transport layer having a shallow HOMO/LUMO with an electron blocking property should certainly play each role.

The TFB material, which is currently widely used as a hole transport layer, shows high electron blocking properties. However, in the case of a metal oxide (e.g., ZnMgO) widely used as an inorganic electron transport layer, a thin film manufactured with a thickness of about 20 nm to about 40 nm by coating a solution prepared by a sol-gel method is used. There is a problem in that device characteristics vary depending on the manufacturing state of the thin film. That is, in the case of a ZnO thin film, since the film is formed using a sol-gel solution, there are many internal defects depending on the oxygen content, and thus, in the light emitting layer 130 including the surrounding quantum dots 131, light emission may be suppressed, or excessive electron transport may occur.

To address this problem, a ZMO thin film doped with a metal M such as Mg having a large oxygen binding energy and a similar ionic radius to a Zn atom may have better device characteristics. $Zn^{2+}$ has an ionic radius of less than or equal to about 0.74 angstrom, and $Mg^{2+}$ has 0.72 angstrom, which is similar to each other. Even at room temperature reaction, they may be mixed with each other and act as a doping element during ZnO growth. Also, it is estimated that a metal M such as Mg having a strong oxidizing property may decrease defects caused by oxygen vacancy and a hydroxide group, in the case of ZMO compared with ZnO, to improve the exciton quenching and hole leak phenomenon of the adjacent light emitting layer 130 including quantum dots 131 and to improve a stability.

As described above, ZMO in which a metal M is doped in ZnO may have better electron transport characteristics than ZnO, but using this alone, there is a limit to provide high luminous efficiency (EQE) and long life-span enough for the light emitting device including quantum dots 131.

In the light emitting device 100 according to an embodiment, the electron auxiliary layer 140 (e.g., electron transport layer (ETL)) includes an orthosilicate compound together with the metal oxide nanoparticles.

Figure 2:
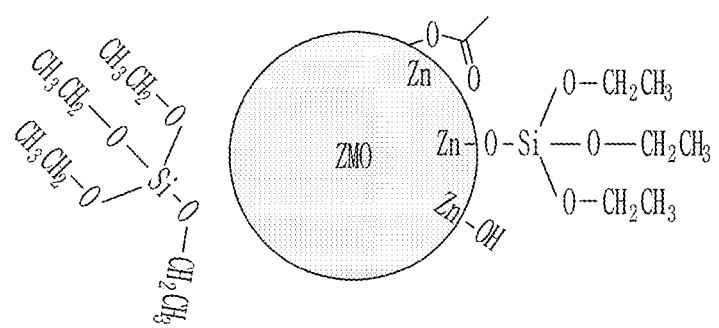
FIG. 2 is a schematic representation of a metal oxide nanoparticle and orthosilicate compounds included in the electron auxiliary layer of the light emitting device.

FIG. 2 is a schematic representation of a metal oxide nanoparticle and orthosilicate compounds included in the electron auxiliary layer of the light emitting device. FIG. 2 illustrates a case where the metal oxide nanoparticle is ZnMgO (ZMO) and the orthosilicate compound is tetraethylorthosilicate (TEOS), but the present disclosure is not limited thereto.

Referring to FIG. 2, ZMO nanoparticles may be grown through a sol-gel dehydration condensation reaction of precursors of zinc and magnesium oxides, for example, $Zn(CH_3COO)_2$, $Mg(CH_3COO)_2$, and the like and a base, for example, tetramethylammonium hydroxide, TMAH. Surface species such as oxygen vacancy and hydroxide group remain on the surface of the synthesized nanoparticles, and they may cause a problem of occurring leakage current by acting as a trap site or a surface defect.

The orthosilicate compound may minimize the surface defect by minimizing the oxygen vacancy and the hydroxide group and may control the growth or agglomeration of the metal oxide nanoparticles depending upon a type of the orthosilicate compound. In addition, the orthosilicate compound may improve a surface planarity of the electron auxiliary layer 140 including the metal oxide nanoparticles by a coupling action of the orthosilicate compound, and accordingly, the electron auxiliary layer 140 suppresses exciton quenching or hole leak phenomenon to improve electron injection characteristics, and thereby improving performance and luminance of the light emitting device including an embodiment of an electron auxiliary layer described herein and providing an increase in the life-span or stability of the device.

Figure 3:
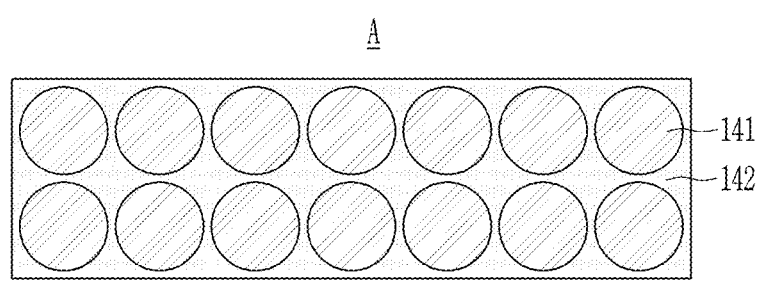
FIGS. 3 and 4 are schematic cross-sectional representations of an enlarged portion A of FIG. 1.
Figure 4:
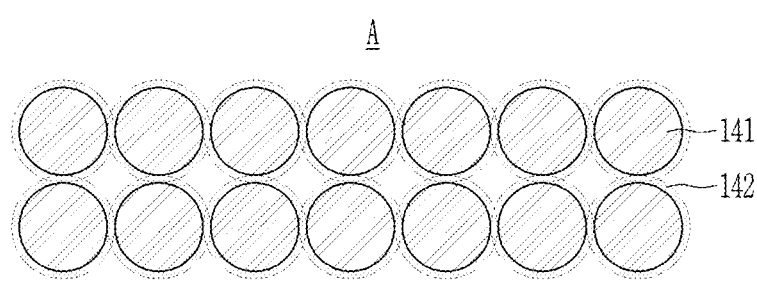
Figure 5:
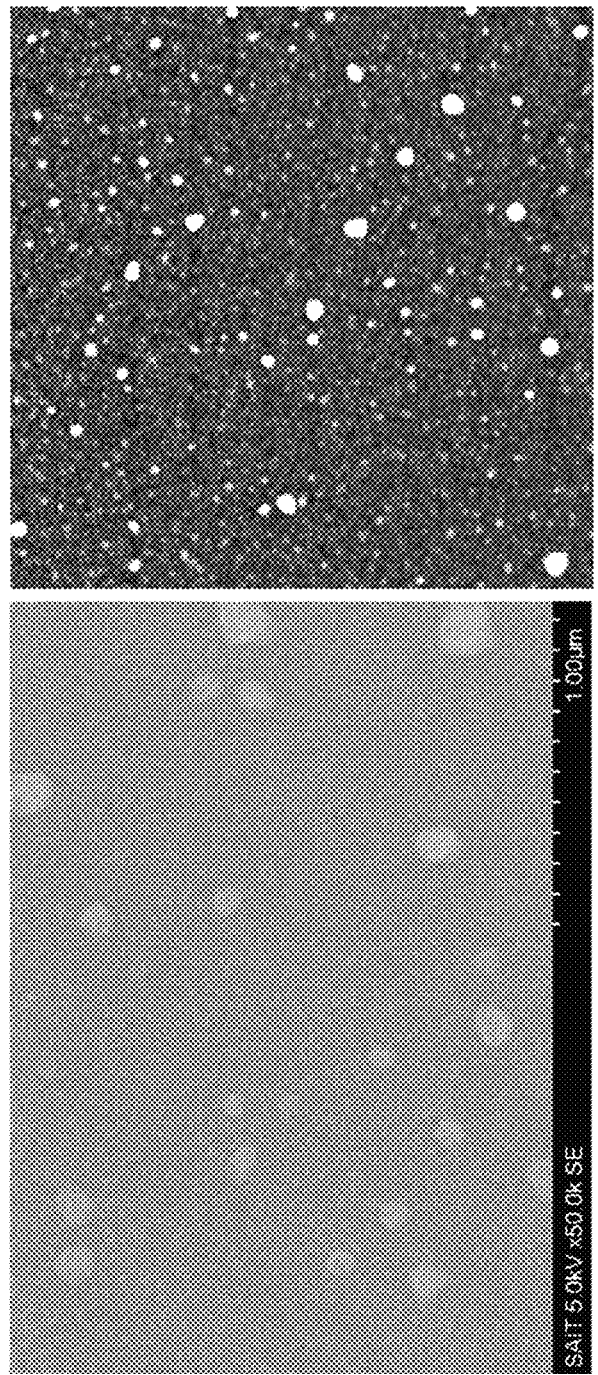
FIG. 5 is a scanning electron microscope (SEM) photograph of a surface of an electron transport layer prepared in accordance with Comparative Example 1-1.
Figure 6:
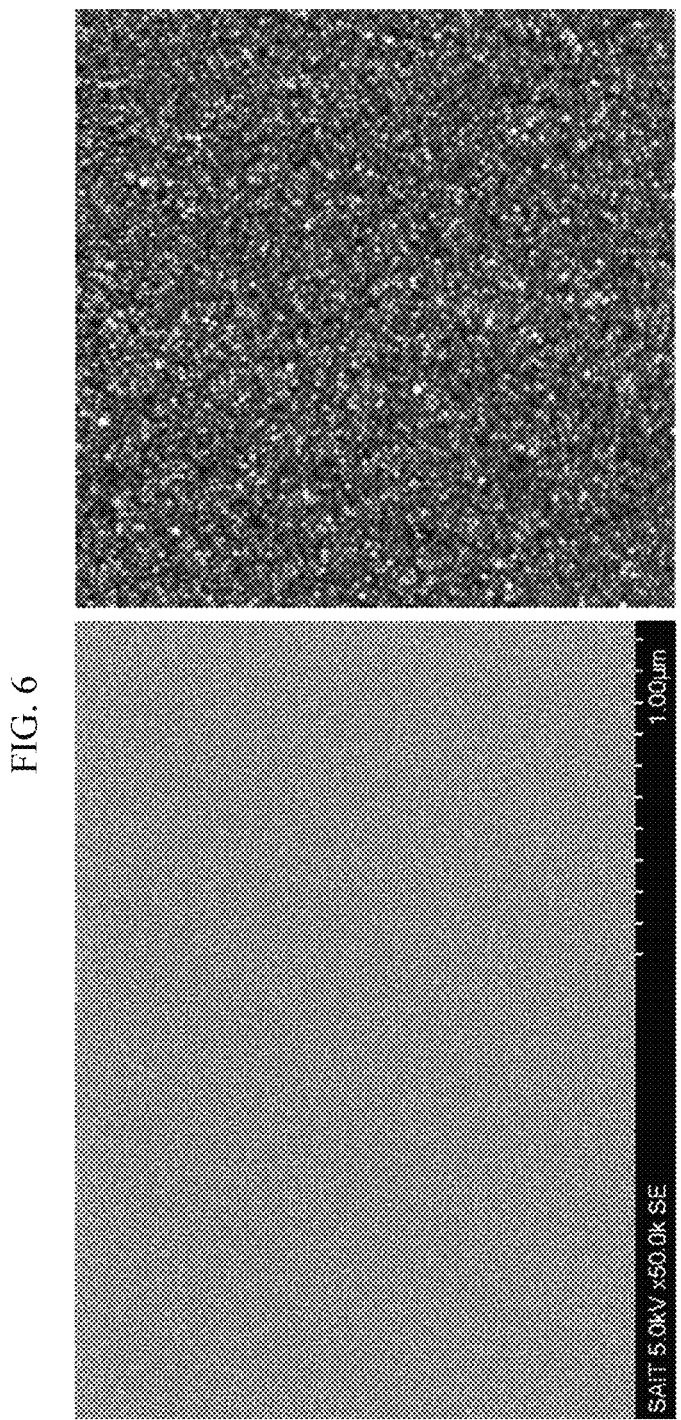
FIG. 6 is a scanning electron microscope (SEM) photograph of a surface of an electron transport layer prepared in accordance with Example 1-1.
Figure 7:
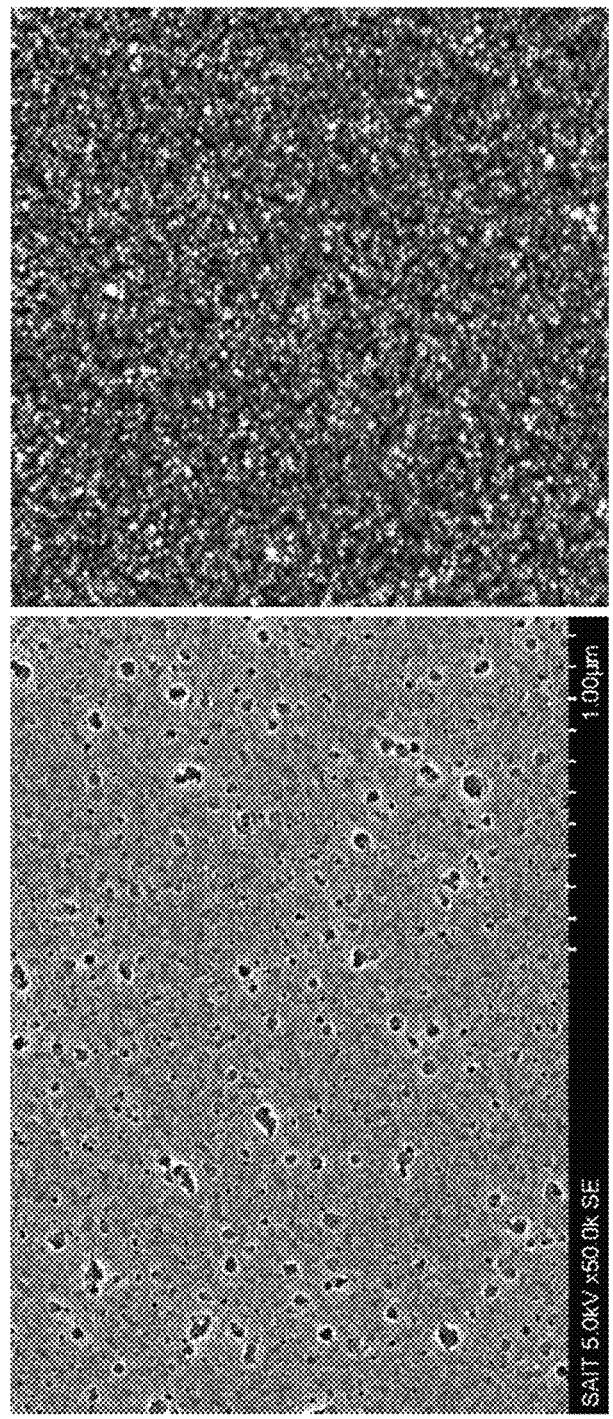
FIG. 7 is a scanning electron microscope (SEM) photograph of a surface of an electron transport layer prepared in accordance with Reference Example 1-1.

FIGS. 3 and 4 are schematic cross-sectional representations of an enlarged portion A of FIG. 1.

Referring to FIG. 3, the orthosilicate compound 142 may be mixed with metal oxide nanoparticles 141 to be dispersed between metal oxide nanoparticles 141. In FIG. 3, the orthosilicate compound 142 is shown to fill all the spaces between the metal oxide nanoparticles 141, but the present disclosure is not limited thereto, and depending on the content of the orthosilicate compound 142, the metal oxide nanoparticles 141 may be completely filled, or may be located partially dispersed.

In this case, at least a portion of the orthosilicate compound 142 may be bound to the surface of the metal oxide nanoparticles 141. The bonding may be a physical or chemical bonding. For example, at least one of the four oxygen anions of the orthosilicate compound 142 may be physically or chemically bound to a metal cation of metal oxide nanoparticles 141.

Referring to FIG. 4, the metal oxide nanoparticles 141 may include a coating layer on the surface of the metal oxide nanoparticles 141 and including at least a portion of the orthosilicate compound 142. In other words, the orthosilicate compound 142 may form a —Si—O—M bond with metal oxide nanoparticle 141 by the hydrolysis condensation reaction, and thus, the orthosilicate compound 142 may form a nano meter-level, ultra-thin coating layer on the surface of the metal oxide nanoparticles 141.

The orthosilicate compound 142 may include a salt or an ester compound thereof as a compound of an anion of silicon tetroxide ($SiO_4^{4-}$). For example, the orthosilicate compound may be represented by Chemical Formula 1.

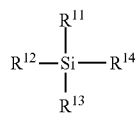

Chemical Formula 1

In Chemical Formula 1, $R^{11}$ to $R^{14}$ are independently a hydroxy group, a halogen, a substituted or unsubstituted C1 to C8 linear or branched alkoxy group, or a substituted or unsubstituted C6 to C12 aryloxy group.

The orthosilicate compound represented by Chemical Formula 1 may be, for example, tetramethyl orthosilicate, tetraethylorthosilicate, tetrabutylorthosilicate, or a combination thereof.

A content of the orthosilicate compound 142 may be greater than or equal to about 5 parts by weight, for example, greater than or equal to 10 parts by weight, greater than or equal to about 20 parts by weight, greater than or equal to about 30 parts by weight, greater than or equal to about 40 parts by weight, or greater than or equal to about 50 parts by weight, and less than or equal to about 500 parts by weight, for example less than or equal to about 400 parts by weight, less than or equal to about 300 parts by weight, less than or equal to about 200 parts by weight, or less than or equal to about 150 parts by weight, about 5 parts by weight to about 500 parts by weight, for example about 10 parts by weight to about 400 parts by weight, about 20 parts by weight to about 300 parts by weight, about 30 parts by weight to about 200 parts by weight, about 40 parts by weight to about 150 parts by weight, or about 50 parts by weight to about 150 parts by weight based on 100 parts by weight of the metal oxide nanoparticles 141.

In addition to the orthosilicate compound 142, the electron auxiliary layer 140 may further include a first silane compound represented by Chemical Formula 2.

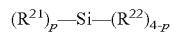

Chemical Formula 2

In Chemical Formula 2, $R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C6 to C12 aryloxy group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group), or —C(=O)ONRR' (wherein R and R' are each independently a C1 to C20 linear or branched alkyl group), $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and p is an integer of 1 to 3.

The first silane compound may include, for example trimethoxysilane, methyltrimethoxysilane, ethyltrimethoxysilane, propyltrimethoxysilane, butyltrimethoxysilane, pentyltrimethoxysilane, hexyltrimethoxysilane, octyltrimethoxysilane, triethoxysilane, methyltriethoxysilane, ethyltriethoxysilane, propyltriethoxysilane, butyltriethoxysilane, pentyltriethoxysilane, hexyltriethoxysilane, octyltriethoxysilane, dimethoxysilane, dimethyldimethoxysilane, diethyldimethoxysilane, dipropyldimethoxysilane, dibutyldimethoxysilane, dipentyldimethoxysilane, dihexyldimethoxysilane, dioctyldimethoxysilane, diethoxysilane, dimethyldiethoxysilane, diethyldiethoxysilane, dipropyldiethoxysilane, dibutyldiethoxysilane, dipentyldiethoxysilane, dihexyldiethoxysilane, dioctyldiethoxysilane, phenyltrimethoxysilane, diphenyldimethoxysilane, phenyltriethoxysilane, diphenyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminooctyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, aminooctyltriethoxysilane, trichlorosilane, methyltrichlorosilane, ethyltrichlorosilane, propyltrichlorosilane, butyltrichlorosilane, pentyltrichlorosilane, hexyltrichlorosilane, octyltrichlorosilane, or a combination thereof.

When the first silane compound includes an aromatic group (e.g., a phenyl group) such as phenyltrimethoxysilane, electrical conduction characteristics of the electron auxiliary layer 140 may be increased, and when the first silane compound includes amino silane such as aminomethyltrimethoxysilane or halo silane such as methyltrichlorosilane in a small amount, reactivity between orthosilicate compounds 142 or between the orthosilicate compound 142 and the first silane compound may be increased.

In addition, the electron auxiliary layer 140 may further include a second silane compound represented by Chemical Formula 3, in addition to the orthosilicate compound 142.

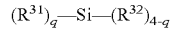

Chemical Formula 3

In Chemical Formula 3, $R^{31}$ is a reactive functional group capable of photo-crosslinking or thermal-crosslinking, that is, a vinyl group; a vinyloxy group; a (meth)acryl group; a (meth)acryloxy group; an epoxy group; a substituted or unsubstituted C2 to C30 alkenyl group; a substituted or unsubstituted C2 to C30 alkynyl group; a spiro-orthoester group; a substituted or unsubstituted C3 to C30 alicyclic organic group having a double bond or a triple bond in the ring; a substituted or unsubstituted C3 to C30 heterocycloalkyl group having a double bond or a triple bond in the ring; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group, $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group or a substituted or unsubstituted C2 to C10 carbonylalkoxy group, and q is an integer of 1 to 3.

The second silane compound may include, for example, vinyl trimethoxysilane, vinyl triethoxysilane, vinyl tris(2-methoxyethoxysilane), or a combination thereof.

Since the second silane compound includes a reactive functional group capable of photo-crosslinking or thermal-crosslinking, the metal oxide nanoparticles 141 are photo-cured or thermo-cured may provide the electron auxiliary layer 140.

The first silane compound and the second silane compound may be present, independent of the other, though in a total amount of greater than or equal to about 1 part by weight in total, for example, greater than or equal to about 5 parts by weight in total, greater than or equal to about 10 parts by weight in total, or greater than or equal to about 15 parts by weight in total, and less than or equal to about 100 parts by weight in total, for example, less than or equal to about 90 parts by weight in total, less than or equal to about 80 parts by weight in total, or less than or equal to about 70 parts by weight in total, or may be included in an amount of about 1 part by weight to about 100 parts by weight in total, for example, about 5 parts by weight to about 90 parts by weight in total, about 10 parts by weight to about 80 parts by weight in total, or about 15 parts by weight to about 70 parts by weight in total based on 100 parts by weight of the orthosilicate compound 142.

The electron auxiliary layer 140 (e.g., electron transport layer (ETL)) may include metal oxide nanoparticles of which the surface is treated with a base including a hydroxy group (OH). The base including the hydroxy group may passivate surface defects of the metal oxide nanoparticles to provide metal oxide nanoparticles with a high conductivity and less defects. Thereby, the electron auxiliary layer 14 may reduce leakage current and relief electron accumulation, so that the efficiency and life-span of the light emitting device 10 may be enhanced.

When treating the surface of the metal oxide nanoparticles with the base including the hydroxy group, the defect may be improved through the additional chemical reaction on the surface of the metal oxide nanoparticles. For example, while a hydroxyl group ($OH^-$) is applied to the surface of the metal oxide nanoparticles, for example, in the case of ZnMgO, by a condensation reaction of Zn—O—Zn(Mg) and $Zn(OH)_4^{2-}$, additional growth of ZnO or MgO proceeds on the surface defect site. This may result in the removal of trap sites by passivating the surface defect of the metal oxide nanoparticles. Thereby, a luminous efficiency of the light emitting device 100 may be enhanced by hole blocking effects of suppressing leakage current of hole generated through a trap site of metal oxide present around a HOMO level of the quantum dot 131.

A thickness of the electron auxiliary layer 140 may be appropriately selected in consideration of the emission wavelength of the quantum dots 131, the thickness of the light emitting layer 130, and the type and thickness of the hole auxiliary layer 120. For example, the quantum dots 131 in the light emitting layer 130 emit light having a center wavelength of about 600 nm to about 640 nm, and the thickness of the electron auxiliary layer 140 may be greater than or equal to about 20 nm, for example, greater than or equal to about 25 nm, greater than or equal to about 30 nm, greater than or equal to about 35 nm, greater than or equal to about 40 nm, or greater than or equal to about 45 nm and less than or equal to about 80 nm, for example, less than or equal to about 75 nm, less than or equal to about 70 nm, less than or equal to about 65 nm, less than or equal to about 60 nm, or less than or equal to about 55 nm. For example, the quantum dots 131 emit light having a center wavelength of less than or equal to about 500 nm, and the thickness of the electron auxiliary layer 140 may be greater than or equal to about 60 nm, for example, greater than or equal to about 65 nm, greater than or equal to about 70 nm, or greater than or equal to about 75 nm and less than or equal to about 120 nm, for example, less than or equal to about 115 nm, less than or equal to about 110 nm, less than or equal to about 105 nm, less than or equal to about 100 nm, less than or equal to about 95 nm, or less than or equal to about 90 nm.

Another embodiment relates to a method of manufacturing the aforementioned light emitting device.

The method of manufacturing a light emitting device may include mixing a metal oxide nanoparticles and an orthosilicate compound to prepare a mixed solution; and applying the mixed solution to form an electron auxiliary layer.

The method of manufacturing the light emitting device may further include forming the first electrode and the second electrode, the light emitting layer, or optionally the hole auxiliary layer.

The mixing of the metal oxide nanoparticles and the orthosilicate compound to prepare the mixed solution may be appropriately selected, and is not particularly limited. For example, the orthosilicate compound is added to a solution including the metal oxide nanoparticles prepared by a sol-gel method, and then stirred.

A method of forming an electron auxiliary layer by applying a mixed solution including the metal oxide nanoparticles and orthosilicate compound may be appropriately selected and is not particularly limited. The electronic auxiliary layer may be formed by a solution process, for example, and may be formed by spin coating, bar coating, spray coating, slit coating, inkjet printing, nozzle printing, spraying, or doctor blade coating, but is limited thereto.

The method of manufacturing the light emitting device may further include contacting the prepared electron auxiliary layer with a base including a hydroxy group (OH).

The contacting of the prepared electron auxiliary layer with the base including the hydroxy group may include dissolving the base including the hydroxyl group in a solvent to prepare a solution, and coating the solution on the electron auxiliary layer, or dipping the electron auxiliary layer in the solution.

As described above, the manufacture of light emitting device is based on a solution process, and basically the light emitting layer, the hole auxiliary layer, and the electron auxiliary layer are formed through a solution process. Thus, the process of surface-treating the plurality of metal oxide nanoparticles with the base including the hydroxy group may also performed by a relatively simple method in which the electron auxiliary layer thin film is surface-treated with a base including a hydroxy group dissolved in a solvent through a solution process to modify characteristics of the electron auxiliary layer.

The method of coating the solution including the base including the hydroxy group on the electronic auxiliary layer may also be a spin coating, a bar coating, a spray coating, a slit coating, an inkjet printing, a nozzle printing, spraying, or a doctor blade coating, but is not limited thereto.

The base including the hydroxy group may have a molecular weight of greater than or equal to about 30 grams per mole (g/mol), for example greater than or equal to about 40 g/mol, greater than or equal to about 50 g/mol, greater than or equal to about 60 g/mol, greater than or equal to about 70 g/mol, greater than or equal to about 80 g/mol, greater than or equal to about 90 g/mol, or greater than or equal to about 100 g/mol and less than or equal to about 600 g/mol, for example less than or equal to about 500 g/mol, less than or equal to about 400 g/mol, or less than or equal to about 300 g/mol, about 30 g/mol to about 600 g/mol, for example about 50 g/mol to about 500 g/mol, about 80 g/mol to about 400 g/mol, or about 100 g/mol to about 300 g/mol.

The base including the hydroxy group may have $pK_b$ of less than or equal to about 10, for example less than or equal to about 9, less than or equal to about 8, or less than or equal to about 7 and greater than or equal to about 5, for example greater than or equal to about 6, greater than or equal to about 7, or greater than or equal to about 8, about 5 to about 10, for example about 6 to about 10, about 7 to about 10, or about 7 to about 9.

The base including the hydroxy group may include an alkali metal hydroxide, an alkyl ammonium hydroxide, or a combination thereof, for example, the alkali metal hydroxide may include LiOH, NaOH, KOH, RbOH, CsOH, or a combination thereof, and the alkyl ammonium hydroxide may include tetramethylammonium hydroxide (TMAH), tetraethylammonium hydroxide (TEAH), tetrapropylammonium hydroxide (TPAH), tetrabutylammonium hydroxide (TBAH), or a combination thereof.

The solvent may include water, acetone, alcohol, ether, ethyl acetate, dimethylsulfoxide (DMSO), or a combination thereof capable of dissolving the base including the hydroxy group.

The concentration of the base including the hydroxy group in the solution may be less than or equal to about 0.1 moles per liter (M), for example less than or equal to about 0.02 M, less than or equal to about 0.015 M, or less than or equal to about 0.010 M and greater than or equal to about 0.001 M, for example greater than or equal to about 0.005 M, or greater than or equal to about 0.008 M, about 0.001 M to about 0.02 M, for example about 0.005 M to about 0.015 M, or about 0.008 M to about 0.010 M.

After contacting the electron auxiliary layer with the base including the hydroxy group, the electron auxiliary layer is dried at room temperature, for example greater than or equal to about 0° C., greater than or equal to about 10° C., or greater than or equal to about 20° C., and less than or equal to about and 100° C., less than or equal to about 90° C., less than or equal to about 80° C., less than or equal to about 70° C., less than or equal to about 60° C., less than or equal to about 50° C., less than or equal to about 40° C., or less than or equal to about 30° C. to remove the solvent from the electron auxiliary layer. In addition, the drying may be performed under vacuum, for example, but is not limited thereto.

When the electron auxiliary layer is washed with the base including the hydroxy group, luminance and life-span characteristics of the light emitting device may be further increased.

Another embodiment provides an electronic device including the aforementioned light emitting device.

The electronic device may be a display device (e.g., QD-LED), a sensor (e.g., biosensor, bio-imaging), a photodetector, a photoelectric conversion device, a laser, or a linear optical device.

Hereinafter, specific embodiments of the present disclosure are presented. However, the examples described below are for illustrative purposes only, and the scope of the present disclosure is not limited thereto.

Preparation Example

Preparation of Solution for Forming Electronic Auxiliary Layer

Preparation Example 1: ZMO Synthesis

Zinc acetate dihydrate, 3.06 millimoles (mmol), 0.54 mmol of magnesium acetate tetrahydrate, and 30 milliliters (mL) of dimethylsulfoxide are introduced into a reactor. Tetramethylammonium hydroxide pentahydrate (TMAH), 5.5 mmol, is added to 10 mL of ethanol and then introduced into the reactor. The reaction mixture is stirred at room temperature (25° C.) for 1 hour, and the obtained $Zn_{0.85}Mg_{0.15}O$ nanoparticles and ethyl acetate are centrifuged at a ratio of 1:4 (volume ratio) and dispersed in ethanol to provide a solution for forming an electron auxiliary layer including $Zn_{0.85}Mg_{0.15}O$ nanoparticles (average particle diameter: about 3 nm).

Preparation Example 2: Rb-ZMO Synthesis

Zinc acetate dihydrate, 3.06 mmol, 0.54 mmol of magnesium acetate tetrahydrate, and 30 mL of dimethylsulfoxide are added to a reactor. Tetramethylammonium hydroxide pentahydrate (TMAH), 5.5 mmol, is added to 10 mL of ethanol and introduced into the reactor. The reaction mixture is stirred at a room temperature (25° C.) for 1 hour, and the obtained $Zn_{0.85}Mg_{0.15}O$ nanoparticles and ethyl acetate are centrifuged at a ratio of 1:4 (volume ratio) and dispersed into ethanol to provide a solution including $Zn_{0.85}Mg_{0.15}O$ nanoparticles (average particle diameter: about 3 nm).

Subsequently, $Rb_2CO_3$ which is dissolved in a EtOH solution is added to the solution of $Zn_{0.85}Mg_{0.15}O$ nanoparticles at 9 wt % relative to the weight of ZnMgO and stirred at a room temperature for 1 hour to provide a solution for forming an electron auxiliary layer. The $Rb_2CO_3$ solution for preparing Rb—ZnMgO is obtained by adding 0.12 g of $Rb_2CO_3$ ro 10 ml of EtOH solution with stirring at a high speed (greater than or equal to 400 rpm) at a room temperature for 1 day.

Example 1: Manufacture of Light Emitting Device

Example 1-1: ZMO-TEOS100 (80° C.)

The first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

Then, a solution including poly[(9,9-dioctylfluorenyl-2, 7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

Next, ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and stirred for 5 minutes to prepare a composition for forming a first blue light emitting layer. The composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

A ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm-thick second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 100 parts by weight of tetraethyl orthosilicate (TEOS) are dispersed in ethanol is spin-coated on the second blue light emitting layer and heat-treated at 80° C. for 30 minutes to form a 20 nm-thick electron transport layer.

Then, 100 nm of aluminum (work function: −4.3 eV) is vacuum-deposited on the electron transport layer to form a second electrode, thereby manufacturing the light emitting device according to Example 1-1.

Example 1-2: ZMO-TEOS50 (80° C.)

A light emitting device is manufactured in accordance with the same procedure as in Example 1-1, except that the content of tetraethyl orthosilicate is changed to 50 parts by weight during forming the electron transport layer (ETL) in Example 1-1.

Example 1-3: ZMO-TEOS150 (80° C.)

A light emitting device is manufactured in accordance with the same procedure as in Example 1-1, except that the content of tetraethyl orthosilicate is changed to 150 parts by weight during forming the electron transport layer (ETL) in Example 1-1.

Comparative Example 1-1: ZMO (80° C.)

A light emitting device is manufactured in accordance with the same procedure as in Example 1-1, except that tetraethyl orthosilicate is not added during forming the electron transport layer (ETL) in Example 1-1.

Comparative Example 1-2: ZMO (RT)

A light emitting device is manufactured in accordance with the same procedure as in Example 1-1, except that tetraethyl orthosilicate is not added during forming the electron transport layer (ETL), and it is obtained at a room temperature (25° C.) in Example 1-1.

Reference Example 1-1: ZMO-OTES100 (80° C.)

A light emitting device is manufactured in accordance with the same procedure as in Example 1-1, except that 100 parts by weight of octyltriethoxysilane (OTES) is used instead of tetraethyl orthosilicate during forming the electron transport layer (ETL) in Example 1-1.

Reference Example 1-2: ZMO-TCOS100 (80° C.)

A light emitting device is manufactured in accordance with the same procedure as in Example 1-1, except that 100 parts by weight of octyltrichlorosilane (TCOS) is used instead of tetraethyl orthosilicate during forming the electron transport layer (ETL) in Example 1-1.

Reference Example 1-3: ZMO-TMMS100 (80° C.)

A light emitting device is manufactured in accordance with the same procedure as in Example 1-1, except that 100 parts by weight of methyltrimethoxysilane (TMMS) is used instead of tetraethyl orthosilicate during forming the electron transport layer (ETL) in Example 1-1.

Experimental Example 1

Evaluation of Surface Shape of Electron Transport Layer

The surfaces of electron transport layers (ETL) prepared in Comparative Example 1-1 (ZMO (80° C.)), Example 1-1 (ZMO+TEOS100 (80° C.)), Reference Example 1-1 (ZMO+OTES100 (80° C.)), and Reference Example 1-2 (ZMO+TCOS100 (80° C.)) are observed using a scanning electron microscopy (SEM), and the surface roughness is measured.

FIGS. 5, 6, 7, and 8 are scanning electron microscopic (SEM) photographs showing surfaces of electron transport layers (ETL) obtained from Comparative Example 1-1, Example 1-1, Reference Example 1-1, and Reference Example 1-2, respectively.

Referring to FIGS. 5, 6, 7, and 8, the surface roughness (Rq) of each of the electron transport layers (ETL) of Comparative Example 1-1, Example 1-1, Reference Example 1-1, and Reference Example 1-2 is 2.16 nm, 0.79 nm, 2.04 nm, and 15.4 nm, respectively, is obtained. As indicated, it is understood that the electron transport layer (ETL) obtained from Example 1-1 improves a planarity compared to the electron transport layers (ETL) obtained from Comparative Example 1-1, Reference Example 1-1 and Reference Example 1-2.

Figure 8:
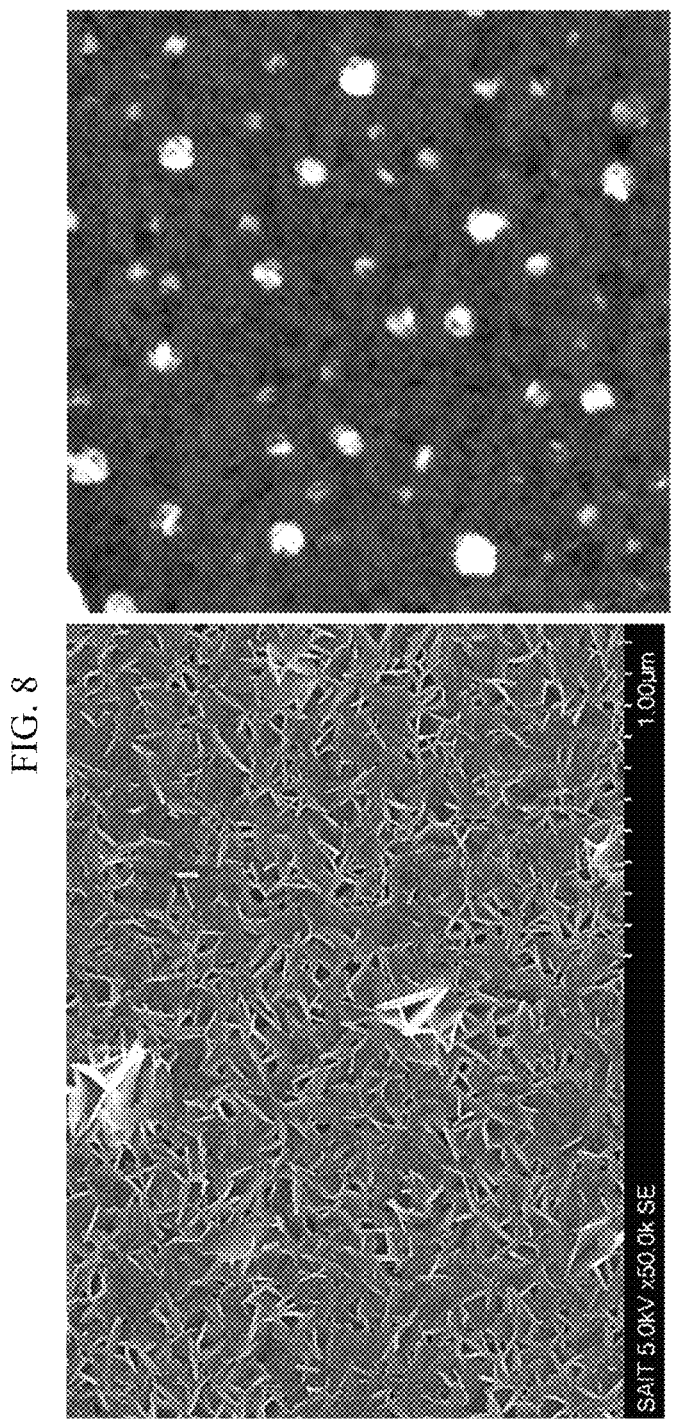
FIG. 8 is a scanning electron microscope (SEM) photograph of a surface of an electron transport layer prepared in accordance with Reference Example 1-2.

As shown in FIG. 8, it appears that $Zn_5(OH)_8Cl_2 \cdot H_2O$ crystal is formed by using octyltrichlorosilane (TCOS) instead of tetraethyl orthosilicate. The surface roughness (Rq) of the electron transport layer (ETL) obtained in accordance with Reference Example 1-2 is significantly increased to 15.4 nm.

Experimental Example 2: Evaluation of Particle Size of Electron Transport Layer

Figure 9:
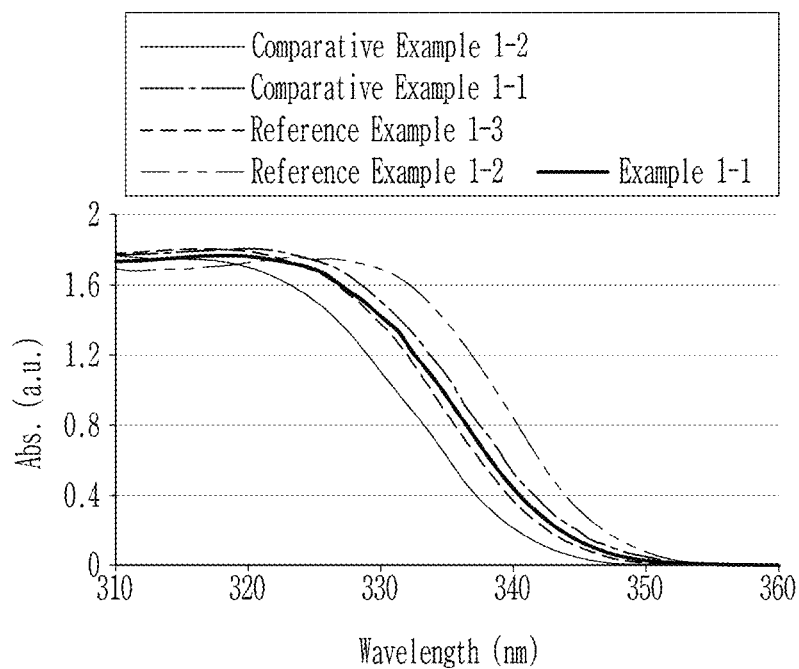
FIG. 9 is a graph showing the results of UV spectroscopic analysis of electron transport layers prepared in accordance with Comparative Example 1-1, Comparative Example 1-2, Example 1-1, Reference Example 1-2, and Reference Example 1-3.

The electron transport layers (ETL) prepared in Comparative Example 1-1 (ZMO (80° C.)), Comparative Example 1-2 (ZMO(RT)), Example 1-1 (ZMO+TEOS100 (80° C.)), Reference Example 1-2 (ZMO+TCOS100 (80° C.)), and Reference Example 1-3 (ZMO+TMMS100 (80° C.)) are measured for a particle size using a UV spectroscopic analysis, and the results are shown in FIG. 9. The UV spectroscopic analysis obtains an UV-Visible absorption spectrum using a Hitachi U-3310 spectrometer.

FIG. 9 is an overlap plot showing UV spectroscopic analysis results of the particle sizes of the electron transport layers (ETL) obtained from the Comparative Example 1-1 and 1-2, Example 1-1, and Reference Example 1-2 and 1-3. Referring to FIG. 9, it is understood that the growth and agglomeration of the metal oxide nanoparticles are controlled depending upon a type of the silane compound, and the order of silane reactivity is as follows: TMMS used in Reference Example 1-2 is higher than TEOS used in Example 1-1; and TCOS is much higher than TMMS used in Reference Example 1-2. As a reference, TMMS suppresses particle growth by the ZMO-silane reaction on the ZMO surface to provide a relatively small particle size as indicated by a short-wavelength absorption. TCOS has a high reactivity with ZMO by Cl to convert ZMO particles to zinc magnesium oxychloride having a different composition, and recrystallization growth occurs so that the particles are enlarged, and which exhibit a relatively long wavelength as shown. In other words, TCOS has a rapid reactivity by Cl, and the ZMO nanoparticle structure is changed to a macro huge sheet-shaped body.

Experimental Example 3

Evaluation of Energy Level of Electron Transport Layer

The electron transport layers (ETL) prepared in Comparative Example 1-1 (ZMO (80° C.)), Example 1-2 (ZMO-TEOS50 (80° C.)), and Example 1-3 (ZMO-TEOS150 (80° C.)) are measured for a work function, a valance band maximum (VBM), and a conduction band minimum (CBM) using an ultraviolet photoelectron spectroscopy (UPS) (measurement condition: hv=21.22 eV, bias=−15 V), and the results are shown in Table 1.

TABLE 1

| | TEOS content (wt %) | Work function (eV) | VBM (eV) | CBM (eV) |
|---|---|---|---|---|
| Comparative Example 1-1 | 0 | 3.69 | 7.65 | 3.95 |
| Example 1-2 | 50 | 3.65 | 7.63 | 3.93 |
| Example 1-3 | 150 | 3.63 | 7.58 | 3.88 |

Referring to Table 1, it is understood that the light emitting device prepared in Example 1-3 improves an electron injection performance as VBM and CBM of the electron transport layer (ETL) are up-shifted by 0.07 eV, and the work function is also up-shifted.

Experimental Example 4: Analysis of Compositions of Electron Transport Layer

A solution in which $Zn_{0.85}Mg_{0.15}O$ prepared in Preparation Example 1 (average particle diameter: 3 nm, HOMO energy level: −7.7 eV, LUMO energy level: −4.3 eV) is dispersed in ethanol is spin-coated and heat-treated at 80° C. for 30 minutes to provide a 20 nm-thick film (Sample 1).

An ethanol solution (10 wt %) of tetraethyl orthosilicate (TEOS) is added in a dropwise fashion on the thin film and reacted for 1 minute to provide a TEOS-treated thin film. The treated thin film is washed with ethanol for 5 times. The washed film is heat-treated at a room temperature (25° C., Sample 2), 80° C. (Sample 3), and 150° C. (Sample 4) for 30 minutes each.

The obtained thin film is subjected to X-ray photoelectron spectroscopy (XPS) analysis, and the results are shown in Table 2. The XPS analysis is performed using Quantum 2000 made by Physical Electronics, Inc under the conditions of 0.5-15 kiloelectron volts (keV), 300 watts (W), and minimum analysis area: 200×200 μm².

TABLE 2

| | C1s | O1s | Mg2p | Si2p | Zn2p3/2 | Si/Zn | Mg/Zn |
|---|---|---|---|---|---|---|---|
| Sample 1 | 32.39 | 40.96 | 3.4 | 0.34 | 22.9 | 0.015 | 0.15 |
| Sample 2 | 30.08 | 41.29 | 3.37 | 1.09 | 24.18 | 0.045 | 0.14 |
| Sample 3 | 30.94 | 40.69 | 2.53 | 0.82 | 25.01 | 0.033 | 0.10 |
| Sample 4 | 32.47 | 39.64 | 2.4 | 0.66 | 24.83 | 0.027 | 0.10 |

Referring to Table 2, when tetraethyl orthosilicate (TEOS) is mixed with the ZMO nanoparticle thin film, a Si peak is detected in the XPS analysis, and when heat treatment is not performed as in Sample 2, the performance characteristics of the device are the most desired and the Si peak tends to decrease with an increase in the heat treatment temperature of the sample 1 film.

Example 2: Manufacture of Light Emitting Device

Example 2-1: ZMO-TEOS100 (RT)

The first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

A solution including poly[(9,9-dioctylfluorenyl-2,7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and then stirred for 5 minutes to prepare a composition for forming a first blue light emitting layer. The composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 100 parts by weight of tetraethyl orthosilicate (TEOS) are dispersed in ethanol is spin-coated on the second blue light emitting layer to form a 20 nm-thick electron transport layer.

Then, 100 nm of aluminum (work function: −4.3 eV) is vacuum-deposited on the electron transport layer to form a second electrode, thereby manufacturing the light emitting device according to Example 2-1.

Example 2-2: ZMO-TEOS150 (RT)

A light emitting device is manufactured in accordance with the same procedure as in Example 2-1, except that the content of tetraethyl orthosilicate is changed to 150 parts by weight during forming the electron transport layer (ETL) in Example 2-1.

Example 2-3: ZMO-TEOS200 (RT)

A light emitting device is manufactured in accordance with the same procedure as in Example 2-1, except that the content of tetraethyl orthosilicate is changed to 200 parts by weight during forming the electron transport layer (ETL) in Example 2-1.

Example 2-4: ZMO-TEOS250 (RT)

A light emitting device is manufactured in accordance with the same procedure as in Example 2-1, except that the content of tetraethyl orthosilicate is changed to 250 parts by weight during forming the electron transport layer (ETL) in Example 2-1.

Comparative Example 2-1: ZMO (80° C.)

A light emitting device is manufactured in accordance with the same procedure as in Example 2-1, except that tetraethyl orthosilicate is not added during forming the electron transport layer (ETL) in Example 2-1.

Experimental Example 5: Evaluation of Device Performance of Light Emitting Device The light emitting devices prepared in Examples 2-1 (ZMO+TEOS100 (RT)) to 2-4 (ZMO+TEOS250 (RT)) and Comparative Example 2-1 (ZMO (RT)) are measured for a device performance, and the results are shown in Table 3. The performances of the light emitting devices are evaluated using a Keithley 2200 source measuring device and a Minolta CS2000 spectroradiometer (current-voltage-luminance measuring device).

TABLE 3

| | EQE Max. (%) | EQE @ 10000 nit (%) | Luminance (nit) | T90 (h) | T50 (h) | OVS[1] (%) |
|---|---|---|---|---|---|---|
| Comparative Example 2-1 | 10.8 | 9.1 | 67530 | 18.63 | 110.0 | 100 |
| Example 2-1 | 11.9 | 9.1 | 67976 | 27.07 | 117.3 | 100 |
| Example 2-2 | 11.8 | 9.2 | 69019 | 23.72 | 110.1 | 100 |
| Example 2-3 | 12.0 | 9.2 | 70856 | 28.24 | 118.9 | 100 |
| Example 2-4 | 13.6 | 10.1 | 72510 | 29.30 | 117.4 | 100 |

[1]OVS: showing Luminance Overshoot according to increasing

1) OVS: showing Luminance Overshoot according to increasing luminance relative to the initial value when the constant current driving adjusting the initial luminance condition.

Referring to Table 3, it is understood that the luminous efficiency (EQE) and life-span are improved as the content of orthosilicate is increased in the ETL.

Example 3: Manufacture of Light Emitting Device

Example 3-1: ZMO-TEOS50/TMAH10 mM

The first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

A solution including poly[(9,9-dioctylfluorenyl-2,7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and stirred for 5 minutes to prepare a composition for forming a first blue light emitting layer. The composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 50 parts by weight of tetraethyl orthosilicate (TEOS) are dispersed in ethanol is spin-coated on the second blue light emitting layer, and heat-treated at 80° C. for 30 minutes to form a 20 nm electron transport layer.

A solution of tetramethylammonium hydroxide (TMAH) is prepared in an ethanol solvent at a concentration of 10 mM, spin-coated on the electron transport layer, and dried under nitrogen atmosphere and room temperature (25° C.) for 1 hour.

Then, 100 nm of aluminum (work function: −4.3 eV) is vacuum-deposited on the electron transport layer to form a second electrode, thereby manufacturing the light emitting device according to Example 3-1.

Example 3-2: ZMO-TEOS100/TMAH10 mM

A light emitting device is manufactured in accordance with the same procedure as in Example 3-1, except that the content of tetraethyl orthosilicate is changed to 100 parts by weight during forming the electron transport layer (ETL) in Example 3-1.

Example 3-3: ZMO-TEOS150/TMAH10 mM

A light emitting device is manufactured in accordance with the same procedure as in Example 3-1, except that the content of tetraethyl orthosilicate is changed to 150 parts by weight during forming the electron transport layer (ETL) in Example 3-1.

Comparative Example 3-1: ZMO/TMAH10 mM

A light emitting device is manufactured in accordance with the same procedure as in Example 3-1, except that tetraethyl orthosilicate is not added during forming the electron transport layer (ETL) in Example 3-1.

Experimental Example 6

Evaluation of Device Performance of Light Emitting Device

The light emitting devices prepared in Examples 3-1 (ZMO-TEOS50/TMAH10 mM) to 3-3 (ZMO-TEOS150/TMAH10 mM) and Comparative Example 3-1 (ZMO/TMAH10 mM) are measured for a device performance, and the results are shown in Table 4. The performances of the light emitting devices are evaluated using a Keithley 2200 source measuring device and a Minolta CS2000 spectroradiometer (current-voltage-luminance measuring device).

TABLE 4

| | EQE Max (%) | EQE @ 10000 nit (%) | luminance (nit) | T90 (h) Max | T90 (h) | T50 (h) | OVS (%) |
|---|---|---|---|---|---|---|---|
| Comparative Example 3-1 | 6.5 | 3.7 | 43891 | 12.8 | 29.3 | 53.1 | 112 |
| Example 3-1 | 6.8 | 4.3 | 52597 | 16.8 | 41.8 | 69.3 | 118 |
| Example 3-2 | 6.2 | 4.0 | 60715 | 24.5 | 57.9 | 89.2 | 117 |
| Example 3-3 | 6.2 | 4.1 | 59242 | 28.4 | 66.6 | 89.2 | 119 |

Referring to Table 4, it is understood that the luminance and life-span characteristics of the light emitting device may be further enhanced by washing the electron auxiliary layer with the base including hydroxy group such as TMAH.

Example 4: Manufacture of Light Emitting Device

Reference Example 4-1: ZMO+TMMS50 (RT)

The first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

A solution including poly[(9,9-dioctylfluorenyl-2,7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and stirred for 5 minutes to prepare a composition for forming a first blue light emitting layer. The composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and then stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm-thick second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 50 parts by weight of methyltrimethoxysilane (TMMS) are dispersed in ethanol is spin-coated on the second blue light emitting layer to form a 20 nm-thick electron transport layer.

Then, 100 nm of aluminum (work function: −4.3 eV) is vacuum-deposited on the electron transport layer to form a second electrode, thereby manufacturing the light emitting device according to Reference Example 4-1.

Reference Example 4-2: ZMO+TMMS150 (RT)

A light emitting device is manufactured in accordance with the same procedure as in Reference Example 4-1, except that the content of methyltrimethoxysilane is changed to 150 parts by weight during forming the electron transport layer (ETL) in Reference Example 4-1.

Reference Example 4-3: ZMO+TMMS50 (80° C.)

A light emitting device is manufactured in accordance with the same procedure as in Reference Example 4-1, except that the heat treatment is performed at 80° C. for 30 minutes during forming the electron transport layer (ETL) in Reference Example 4-1.

Reference Example 4-4: ZMO+TMMS150 (80° C.)

A light emitting device is manufactured in accordance with the same procedure as in Reference Example 4-2, except that the heat treatment is performed at 80° C. for 30 minutes during forming the electron transport layer (ETL) in Reference Example 4-2.

Comparative Example 4-1: ZMO (RT)

A light emitting device is manufactured in accordance with the same procedure as in Reference Example 4-1, except that methyltrimethoxysilane is not added during forming the electron transport layer (ETL) in Reference Example 4-1.

Comparative Example 4-2: ZMO (80° C.)

A light emitting device is manufactured in accordance with the same procedure as in Comparative Example 4-1, except that the heat treatment is performed at 80° C. for 30 minutes during forming the electron transport layer (ETL) in Comparative Example 4-1.

Experimental Example 7

Evaluation of Device Performance of Light Emitting Device

The light emitting devices prepared in Reference Examples 4-1 (ZMO+TMMS50(RT)) to 4-4 (ZMO TMMS150 (80° C.)) and Comparative Examples 4-1 (ZMO (RT)) to 4-2 (ZMO (80° C.)) are measured for a device performance, and the results are shown in Table 5. The performances of the light emitting devices are evaluated using a Keithley 2200 source measuring device and a Minolta CS2000 spectroradiometer (current-voltage-luminance measuring device).

TABLE 5

| | EQE Max (%) | EQE @ 10000 nit (%) | Luminance (nit) | T90 (h) Max | T90 (h) | T50 (h) | OVS (%) |
|---|---|---|---|---|---|---|---|
| Comparative Example 4-1 | 11.4 | 9.3 | 67699 | 18.26 | 22.0 | 102 | 101 |
| Reference Example 4-1 | 11.7 | 9.0 | 56637 | 19.07 | 9.30 | 49 | 100 |
| Reference Example 4-2 | 10.9 | 8.2 | 58405 | 14.95 | 19.3 | 49 | 100 |
| Comparative Example 4-2 | 10.3 | 8.9 | 69449 | 17.48 | 22.9 | 119 | 101 |
| Reference Example 4-3 | 11.7 | 9.3 | 61490 | 13.48 | 13.5 | 49 | 100 |
| Reference Example 4-4 | 11.0 | 8.6 | 61282 | 17.21 | 19.5 | 49 | 101 |

Referring to Table 5, it is understood that the characteristics of the light emitting device are decreased by adding methyltrimethoxysilane (TMMS) in comparison to the orthosilicate compound.

Example 5: Manufacture of Light Emitting Device

Reference Example 5-1: ZMO+OTES50 (RT)

The first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

A solution including poly[(9,9-dioctylfluorenyl-2,7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and stirred for 5 minutes to prepare a composition for forming a first blue light emitting layer. Thereafter, the composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm-thick second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 50 parts by weight of octyltriethoxysilane (OTES) are dispersed in ethanol is spin-coated on the second blue light emitting layer to form a 20 nm-thick electron transport layer.

Then, 100 nm of aluminum (work function: −4.3 eV) is vacuum-deposited on the electron transport layer to form a second electrode, thereby manufacturing the light emitting device according to Reference Example 5-1.

Reference Example 5-2: ZMO+OTES100 (RT)

A light emitting device is manufactured in accordance with the same procedure as in Reference Example 5-1, except that the content of octyltriethoxysilane is changed to 100 parts by weight during forming the electron transport layer (ETL) in Reference Example 5-1.

Comparative Example 5-1: ZMO50 (RT)

A light emitting device is manufactured in accordance with the same procedure as in Reference Example 5-1, except that octyltriethoxysilane is not added during forming the electron transport layer (ETL) in Reference Example 5-1.

Experimental Example 8: Evaluation of Device Performance of Light Emitting Device The light emitting devices prepared in Reference Examples 5-1 (ZMO+OTES50(RT)) and 5-2 (ZMO+OTES100(RT)) and Comparative Example 5-1 (ZMO50 (RT)) are measured for a device performance, and the results are shown in Table 6. The performances of the light emitting devices are evaluated using a Keithley 2200 source measuring device and a Minolta CS2000 spectroradiometer (current-voltage-luminance measuring device).

TABLE 6

|  | EQE Max (%) | EQE@ 10000 nit (%) | Luminance (nit) | T90 (h) Max | T90 (h) | T50 (h) | OVS (%) |
|---|---|---|---|---|---|---|---|
| Comparative Example 5-1 | 10.4 | 8.6 | 64936 | 17.4 | 19.9 | 26.4 | 101 |
| Reference Example 5-1 | 12.7 | 9.0 | 62638 | 15.6 | 15.6 | 26.3 | 100 |
| Reference Example 5-2 | 12.6 | 9.4 | 63441 | 17.0 | 18.2 | 26.2 | 100 |

Referring to Table 6, it is understood that the characteristics of the light emitting device are decreased by adding octyltriethoxysilane (OTES) in comparison to the orthosilicate compound.

Example 6: Manufacture of Light Emitting Device

Example 6-1: ZMO-TEOS100 (RT)

A first electrode (anode), ITO (work function: −4.850 eV) is deposited on the glass substrate, and after surface treatment with UV-ozone for 15 minutes, PEDOT solution (HOMO energy level: −5.3 eV, HC Starks)) is spin-coated and heat-treated at 150° C. for 30 minutes in a nitrogen atmosphere to form a 30 nm-thick hole injection layer.

A solution including poly[(9,9-dioctylfluorenyl-2,7-diyl-co(4,4'-(N-4-butylphenyl)diphenylamine)] (TFB, HOMO energy level: −5.56 eV, LUMO energy level: −2.69 eV, Sumitomo Corporation) dissolved in toluene is spin-coated on the hole injection layer and heat-treated at 150° C. for 30 minutes to form a 25 nm-thick hole transport layer.

ZnTeSe/ZnSeS core-shell blue quantum dots with oleate attached as a hydrophobic ligand on the surface (average particle diameter: 10 nm, peak wavelength: about 451 nm, HOMO energy level: −5.7 eV, LUMO energy level: −3.0 eV) are added to octane and stirred for 5 minutes to prepare a composition for forming a first blue light emitting layer. The composition for forming a first blue light emitting layer is spin-coated on the hole transport layer and heat-treated at 150° C. for 30 minutes in a nitrogen atmosphere to form a 20 nm-thick first blue light emitting layer.

An ethanol solution (concentration: 10 mg/mL) of zinc chloride is added in a dropwise fashion onto the first blue light emitting layer and reacted for 1 minute to obtain a film treated with $ZnCl_2$. The treated film is washed 5 times with ethanol. The washed film is heat-treated at 80° C. for 30 minutes.

ZnTeSe/ZnSeS core-shell quantum dots with chloride (Cl) attached to the surface as a hydrophobic ligand (average particle diameter: 10 nm, peak wavelength: about 451 nm, HOMO energy level: −5.9 eV, LUMO energy level: −3.2 eV) is added to hexane and stirred for 5 minutes to prepare a composition for forming a second blue light emitting layer. The composition for forming a second blue light emitting layer is spin-coated on the first blue light emitting layer and heat-treated at 120° C. for 30 minutes in a nitrogen atmosphere to form a 20 nm-thick second blue light emitting layer.

A solution for forming an electron transport layer in which 100 parts by weight of $Zn_{0.85}Mg_{0.15}O$ prepared in Preparation Example 1 (average particle diameter: 3 nm, HOMO energy level: −7.7 eV, LUMO energy level: −4.3 eV) and 100 parts by weight of tetraethyl orthosilicate (TEOS) dispersed in ethanol is spin-coated on the second blue light emitting layer to form a 20 nm-thick electron transport layer.

Then, 100 nm of aluminum (work function: −4.3 eV) is vacuum-deposited on the electron transport layer to form a second electrode, thereby manufacturing the light emitting device according to Example 6-1.

Example 6-2

A light emitting device is manufactured in accordance with the same procedure as in Example 6-1, except that the content of tetraethyl orthosilicate is changed to 150 parts by weight during forming the electron transport layer (ETL) in Example 6-1.

Reference Example 6-1: ZMO-APTES100 (RT)

A light emitting device is manufactured in accordance with the same procedure as in Example 6-1, except that 100 parts by weight of (3-aminopropyl)triethoxysilane (ATPES) is used instead of tetraethyl orthosilicate during forming the electron transport layer (ETL) in Example 6-1.

Reference Example 6-2: ZMO-APTES150 (RT)

A light emitting device is manufactured in accordance with the same procedure as in Example 6-1, except that 150 parts by weight of (3-aminopropyl)triethoxysilane (ATPES) is used instead of tetraethyl orthosilicate during forming the electron transport layer (ETL) in Example 6-1.

Experimental Example 9

Evaluation of Device Performance of Light Emitting Device

The light emitting devices manufactured in Examples 6-1 (ZMO-TEOS100(RT)) and 6-2 (ZMO-TEOS150(RT)) and Reference Examples 6-1 (ZMO-APTES100(RT)) and 6-2 (ZMO-APTES150(RT)) are measured for a device performance, and the results are shown in Table 7. The performances of the light emitting devices are evaluated using a Keithley 2200 source measuring device and a Minolta CS2000 spectroradiometer (current-voltage-luminance measuring device).

TABLE 7

|  | EQE Max (%) | EQE @ 10000 nit (%) | luminance (nit) | T90 (h) | T50 (h) | OVS (%) |
|---|---|---|---|---|---|---|
| Example 6-1 | 11.9 | 9.1 | 67976 | 27.1 | 117 | 100 |
| Example 6-2 | 11.8 | 9.2 | 69019 | 23.7 | 110 | 100 |
| Reference Example 6-1 | 11.0 | 9.2 | 37616 | 0.68 | 4.4 | 100 |
| Reference Example 6-2 | 8.6 | 7.9 | 32743 | 0.66 | 4.1 | 100 |

Referring to Table 7, it is understood that the luminance and life-span characteristics of the light emitting device are rapidly decreased by adding (3-aminopropyl)triethoxysilane (ATPES) instead of the orthosilicate compound.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

DESCRIPTION OF SYMBOLS

100: light emitting device
110: first electrode
120: hole auxiliary layer
130: light emitting layer
131: quantum dot
140: electron auxiliary layer
141: metal oxide nanoparticles
142: orthosilicate compound
150: second electrode

What is claimed is:

1. A light emitting device, comprising
a first electrode and a second electrode each having a surface opposite the other,
a light emitting layer disposed between the first electrode and the second electrode, and
an electronic auxiliary layer disposed between the light emitting layer and the second electrode, wherein the electron auxiliary layer comprises metal oxide nanoparticles and an orthosilicate compound.

2. The light emitting device of claim 1, wherein at least a portion of the orthosilicate compound is bound to a surface of the metal oxide nanoparticles.

3. The light emitting device of claim 1, wherein the metal oxide nanoparticles comprise a coating layer on a surface of the metal oxide nanoparticles, the coating layer including at least a portion of the orthosilicate compound.

4. The light emitting device of claim 1, wherein the orthosilicate compound is represented by Chemical Formula 1:

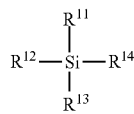

Chemical Formula 1 wherein, in Chemical Formula 1,
$R^{11}$ to $R^{14}$ are independently a hydroxy group, a halogen, a substituted or unsubstituted C1 to C8 linear or branched alkoxy group, or a substituted or unsubstituted C6 to C12 aryloxy group.

5. The light emitting device of claim 1, wherein the orthosilicate compound comprises tetramethylorthosilicate, tetraethylorthosilicate, tetrapropylorthosilicate, tetrabutylorthosilicate, or a combination thereof.

6. The light emitting device of claim 1, wherein the orthosilicate compound is present in an amount of about 5 parts by weight to about 500 parts by weight, based on 100 parts by weight of the metal oxide nanoparticles.

7. The light emitting device of claim 1, wherein the electron auxiliary layer further comprises a first silane compound represented by Chemical Formula 2:

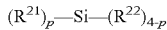 Chemical Formula 2 wherein, in Chemical Formula 2,
$R^{21}$ is a substituted or unsubstituted C6 to C20 aryl group, a substituted or unsubstituted C1 to C20 linear or branched alkyl group, a substituted or unsubstituted C1 to C20 aminoalkyl group, a substituted or unsubstituted C6 to C12 aryloxy group, a substituted or unsubstituted C2 to C20 alkynyl group, C2 to C20 alkenyl group, a substituted or unsubstituted C1 to C20 amine group, —C(═O)OR', wherein R' is a 01 to C20 linear or branched alkyl group, or —C(═O)ONR'R", wherein R' and R" are independently a C1 to C20 linear or branched alkyl group,
$R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and
p is an integer of 1 to 3.

8. The light emitting device of claim 7, wherein the first silane compound comprises trimethoxysilane, methyltrimethoxysilane, ethyltrimethoxysilane, propyltrimethoxysilane, butyltrimethoxysilane, pentyltrimethoxysilane, hexyltrimethoxysilane, octyltrimethoxysilane, triethoxysilane, methyltriethoxysilane, ethyltriethoxysilane, propyltriethoxysilane, butyltriethoxysilane, pentyltriethoxysilane, hexyltriethoxysilane, octyltriethoxysilane, dimethoxysilane, dimethyldimethoxysilane, diethyldimethoxysilane, dipropyldimethoxysilane, dibutyldimethoxysilane, dipentyldimethoxysilane, dihexyldimethoxysilane, dioctyldimethoxysilane, diethoxysilane, dimethyldiethoxysilane, diethyldiethoxysilane, dipropyldiethoxysilane, dibutyldiethoxysilane, dipentyldiethoxysilane, dihexyldiethoxysilane, dioctyldiethoxysilane, phenyltrimethoxysilane, diphenyldimethoxysilane, phenyltriethoxysilane, diphenyldiethoxysilane, aminomethyltrimethoxysilane, aminoethyltrimethoxysilane, aminopropyltrimethoxysilane, am inobutyltrimethoxysilane, aminopentyltrimethoxysilane, aminohexyltrimethoxysilane, aminooctyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, aminooctyltriethoxysilane, trichlorosilane, methyltrichlorosilane, ethyltrichlorosilane, propyltrichlorosilane, butyltrichlorosilane, pentyltrichlorosilane, hexyltrichlorosilane, octyltrichlorosilane, or a combination thereof.

9. The light emitting device of claim 1, wherein the electron auxiliary layer further comprises a second silane compound represented by Chemical Formula 3:

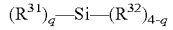 Chemical Formula 3 wherein, in Chemical Formula 3,
$R^{31}$ is a reactive functional group capable of photo-crosslinking or thermal-crosslinking including: a vinyl group; a vinyloxy group; a (meth)acryl group; a (meth) acryloxy group; an epoxy group; a substituted or unsubstituted C2 to C30 alkenyl group; a substituted or unsubstituted C2 to C30 alkynyl group; spiro-orthoester group; a substituted or unsubstituted C3 to C30 alicyclic organic group having a double bond or a triple bond in the ring; a substituted or unsubstituted C3 to C30 heterocycloalkyl group having a double bond or a triple bond in the ring; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group,
$R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and
q is an integer of 1 to 3.

10. The light emitting device of claim 9, wherein the second silane compound comprises vinyl trimethoxysilane, vinyl triethoxysilane, vinyl tris(2-methoxyethoxysilane), or a combination thereof.

11. The light emitting device of claim 9, wherein the first silane compound, and the second silane compound, are present at a concentration independent of the other though in a total amount of about 1 part by weight to about 100 parts by weight, based on 100 parts by weight of the orthosilicate compound.

12. The light emitting device of claim 1, wherein the metal oxide nanoparticles of the electron auxiliary layer are surface-treated with a base including a hydroxy group (OH).

13. The light emitting device of claim 1, wherein the metal oxide comprises Zn, Mg, Ca, Zr, W, Li, Ti, Y, Al, Rb, or a combination thereof.

14. The light emitting device of claim 1, wherein the metal oxide is represented by Chemical Formula 4:

$$Zn_{1-x}M_xO \qquad \text{Chemical Formula 4}$$

wherein, in Chemical Formula 4,
M is Mg, Ca, Zr, W, Li, Ti, Y, Al, Rb, or a combination thereof, and
$0 \leq x \leq 0.5$.

15. The light emitting device of claim 1, wherein the metal oxide nanoparticles have an average particle size of about 1 nanometer to about 100 nanometer.

16. The light emitting device of claim 1, wherein the light emitting layer comprises quantum dots.

17. The light emitting device of claim 1, wherein the light emitting device further comprises a hole auxiliary layer including a hole injecting layer, a hole transporting layer, an electron blocking layer, or a combination thereof, between the first electrode and the light emitting layer.

18. A method of manufacturing a light emitting device, comprising
mixing metal oxide nanoparticles and an orthosilicate compound to prepare a mixed solution; and
applying the mixed solution to form an electron auxiliary layer.

19. The method of claim 18, wherein the applying the mixed solution comprises spin coating, bar coating, spray coating, slit coating, inkjet printing, nozzle printing, spraying, or doctor blade coating.

20. The method of claim 18, further comprising contacting the prepared electron auxiliary layer with a base including a hydroxy group.

21. The method of claim 20, wherein the base including the hydroxy group may include alkaline metal hydroxide, alkylammonium hydroxide, or a combination thereof.

22. The method of claim 20, wherein
the contacting of the prepared electron auxiliary layer with the base including the hydroxy group comprises
mixing the base in a solvent to prepare a base solution, and
applying the base solution on the electron auxiliary layer in the form of a coating, or dipping the electron auxiliary layer in the base solution.

23. An electronic device comprising the light emitting device of claim 1.

24. The electronic device of claim 23, wherein the electronic device is a display device, a sensor, a photodetector, a photoelectric conversion device, a laser, or a linear optical device.

* * * * *